(12) United States Patent
Yeon et al.

(10) Patent No.: US 12,593,705 B2
(45) Date of Patent: Mar. 31, 2026

(54) HYBRID CORE SUBSTRATE WITH EMBEDDED COMPONENTS

(71) Applicant: QUALCOMM Incorporated, San Diego, CA (US)

(72) Inventors: Jaehyun Yeon, San Diego, CA (US); Suhyung Hwang, Rancho Mission Viejo, CA (US); Omar James Bchir, San Marcos, CA (US); Hyunchul Cho, Suwon (KR); Yeoil Park, Sejong (KR)

(73) Assignee: QUALCOMM INCORPORATED, San Diego, CA (US)

( * ) Notice: Subject to any disclaimer, the term of this patent is extended or adjusted under 35 U.S.C. 154(b) by 399 days.

(21) Appl. No.: 18/296,843

(22) Filed: Apr. 6, 2023

(65) Prior Publication Data

US 2024/0339414 A1     Oct. 10, 2024

(51) Int. Cl.
*H10W 70/60* (2026.01)
*H10W 70/05* (2026.01)
(Continued)

(52) U.S. Cl.
CPC ......... *H10W 70/614* (2026.01); *H10W 70/05* (2026.01); *H10W 70/611* (2026.01); *H10W 70/65* (2026.01); *H10W 70/685* (2026.01)

(58) Field of Classification Search
CPC ............. H01L 23/5389; H01L 21/4857; H01L 23/5383; H01L 23/5386; H01L 25/16; H01L 25/18; H01L 23/49822; H01L 21/486; H01L 23/49816; H01L 25/50; H01L 2225/06517; H01L 2225/06548; H01L 23/5385; H01L 24/82; H01L 25/0652; H01L 23/5384; H05K 1/181; H05K 1/185; H05K 1/186; H05K 3/4602
See application file for complete search history.

(56) References Cited

U.S. PATENT DOCUMENTS

2006/0003495 A1     1/2006   Sunohara et al.
2012/0228754 A1 *   9/2012   Liu ......................... A61P 19/00
                                                                  257/676
(Continued)

OTHER PUBLICATIONS

International Search Report and Written Opinion—PCT/US2024/021312—ISA/EPO—Jul. 11, 2024.

*Primary Examiner* — Marlon T Fletcher
*Assistant Examiner* — Christina A Sylvia
(74) *Attorney, Agent, or Firm* — Muncy, Geissler, Olds & Lowe, P.C.

(57) ABSTRACT

A hybrid core substrate with embedded components, and methods for making the same, are disclosed. In an aspect a hybrid core substrate comprises a rigid core, a first laminate layer structure disposed above and mounted to the top surface of the rigid core and having a cavity in which a first component is embedded, and a second laminate layer structure disposed above and mounted to a top surface of the first laminate layer structure and having at least one electrical connection to the first laminate layer structure and at least one electrical connection to the first component, a first plurality of contacts disposed on the top surface of the second laminate layer structure and electrically connected to the second laminate layer structure. In some aspects, at least one contact is electrically connected to the embedded component.

30 Claims, 10 Drawing Sheets

(51) Int. Cl.
    *H10W 70/65*        (2026.01)
    *H10W 70/685*     (2026.01)

(56)                 References Cited

U.S. PATENT DOCUMENTS

| | | | |
|---|---|---|---|
| 2015/0034374 A1* | 2/2015 | Shimizu | H01L 21/4857 |
| | | | 174/257 |
| 2016/0093567 A1* | 3/2016 | Kim | H01L 23/49827 |
| | | | 257/532 |
| 2020/0111732 A1* | 4/2020 | Kanbe | H01L 23/49822 |

* cited by examiner 300 302

308
308
308
308
306

304

308

310

308        Cavity

308 {

310

Cavity

312

308 {

314

316

308 {

314

316
308
318
300
322
320
324

302

314

326
316
308
318
300
322
320
324

326

302

314

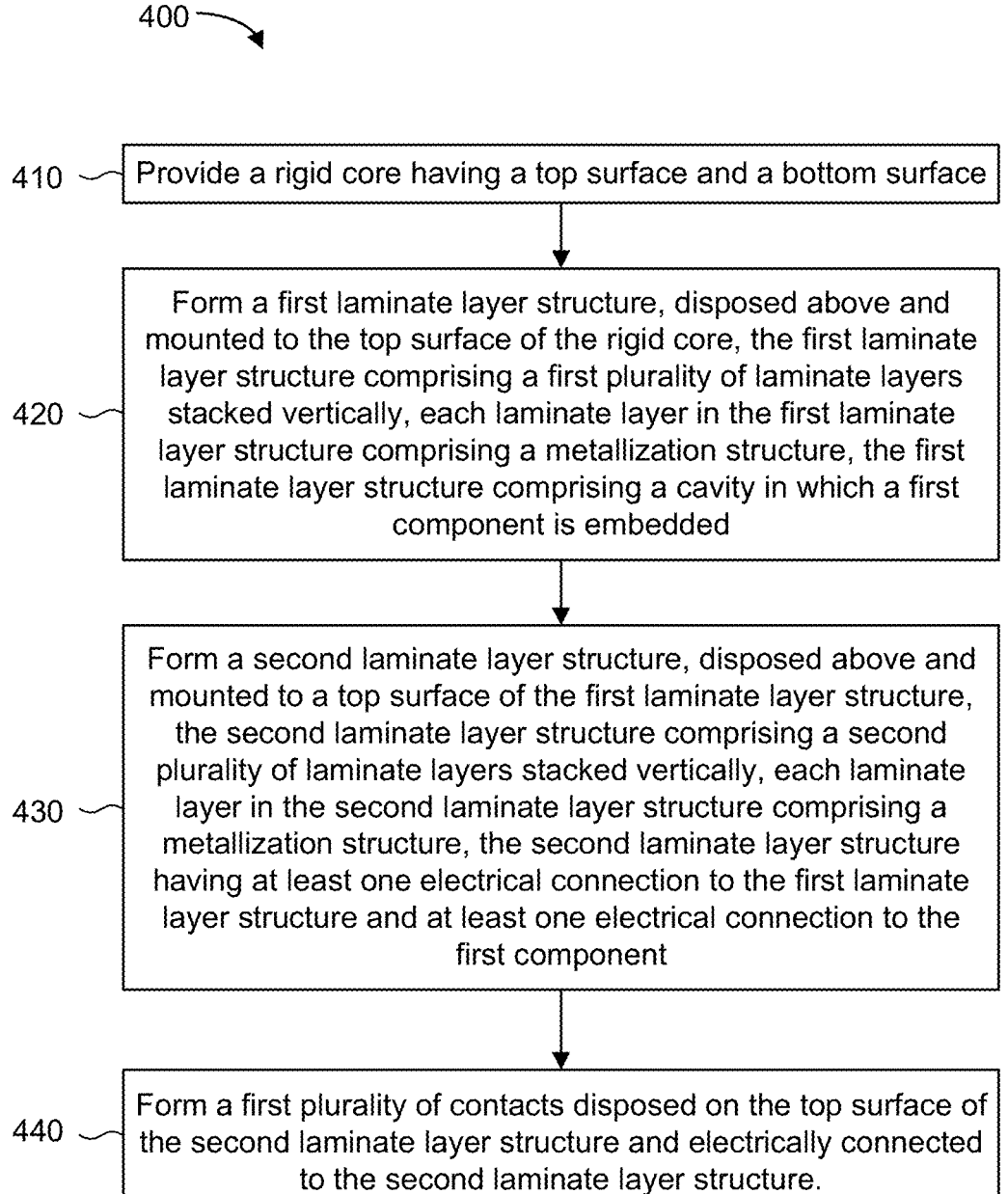

400

410 — Provide a rigid core having a top surface and a bottom surface

420 — Form a first laminate layer structure, disposed above and mounted to the top surface of the rigid core, the first laminate layer structure comprising a first plurality of laminate layers stacked vertically, each laminate layer in the first laminate layer structure comprising a metallization structure, the first laminate layer structure comprising a cavity in which a first component is embedded 430 — Form a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component 440 — Form a first plurality of contacts disposed on the top surface of the second laminate layer structure and electrically connected to the second laminate layer structure.

*FIG. 4*

HYBRID CORE SUBSTRATE WITH EMBEDDED COMPONENTS

BACKGROUND OF THE DISCLOSURE

1. Field of the Disclosure

This disclosure relates generally to packaging and packaging substrates, and more specifically, but not exclusively, to hybrid core substrates with embedded components.

2. Description of the Related Art

FIG. 1 a side cross-sectional view of a conventional apparatus 100 that includes a core 102 to which multi-layer substrates 104 have been attached above and below the core 102, and which are electrically connected to each other through vias 106. FIG. 1 illustrates a disadvantage of the use of this design-namely, that the core 102 must be relatively thick (e.g., T=1.2 mm) to maintain flatness when used with large body substrates, such as multi-layer substrates 104.

As a result, the distance D between a component mounted on the top surface, such as an IC 108, and a component mounted on the bottom surface, such as a bypass capacitor 110, is so large that the bypass capacitor 110 becomes ineffective for its purpose due to the resistance, inductance, or capacitance associated with the long metal path from IC 108 to bypass capacitor 110. The same may be true for other components, i.e., the large distance D between top-mounted components and bottom-mounted components may impair the function of those components.

Thus, there is a need for a better approach having none of the disadvantages described above.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a hybrid core substrate includes a rigid core having a top surface and a bottom surface; a first laminate layer structure having a top surface and a bottom surface, the first laminate layer structure disposed above and mounted to the top surface of the rigid core, the first laminate layer structure comprising a first plurality of laminate layers stacked vertically, each laminate layer in the first laminate layer structure comprising a metallization structure, and the first laminate layer structure comprising a cavity in which a first component is embedded; a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component; and a first plurality of contacts disposed on the top surface of the second laminate layer structure and electrically connected to the second laminate layer structure.

In an aspect, a method for fabricating a hybrid core substrate includes providing a rigid core having a top surface and a bottom surface; forming a first laminate layer structure, disposed above and mounted to the top surface of the rigid core, the first laminate layer structure comprising a first plurality of laminate layers stacked vertically, each laminate layer in the first laminate layer structure comprising a metallization structure, the first laminate layer structure comprising a cavity in which a first component is embedded; forming a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component; and forming a first plurality of contacts disposed on the top surface of the second laminate layer structure and electrically connected to the second laminate layer structure.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein like reference numbers represent like parts, which are presented solely for illustration and not limitation of the disclosure.

FIG. 4 is a flowchart illustrating steps of an exemplary process for fabricating a hybrid core substrate with components, according to aspects of the disclosure.

Figure 1:
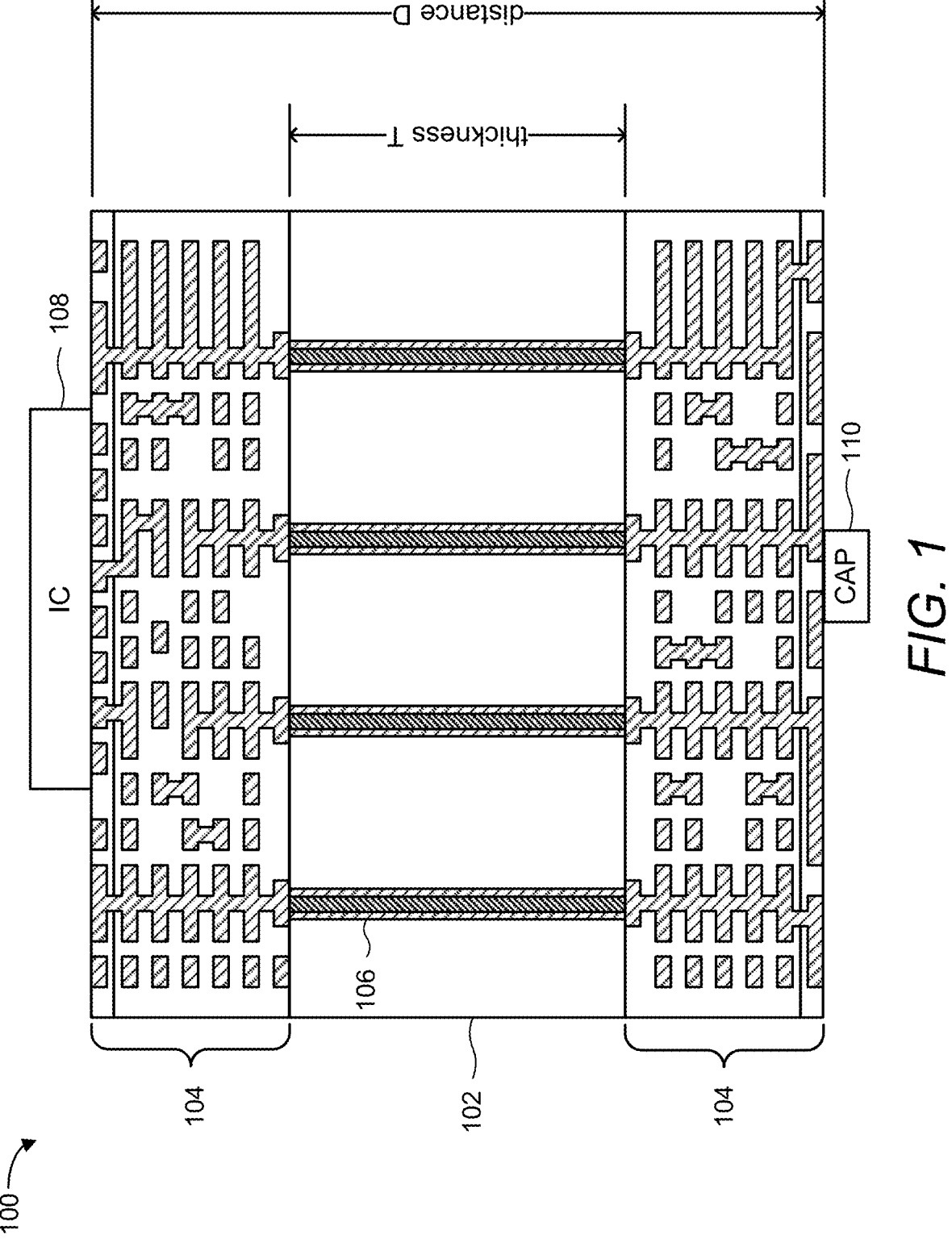
FIG. 1 a side cross-sectional view of a conventional apparatus that includes a core to which multi-layer substrates have been attached above and below the core.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

A hybrid core substrate with embedded components, and methods for making the same, are disclosed. In an aspect a hybrid core substrate comprises a rigid core. A first laminate layer structure is disposed above and mounted to the top surface of the rigid core and has a cavity in which a first component is embedded. A second laminate layer structure is disposed above and mounted to a top surface of the first laminate layer structure and has at least one electrical connection to the first laminate layer structure and at least one electrical connection to the first component. A first plurality of contacts is disposed on the top surface of the second laminate layer structure and electrically connected to the second laminate layer structure. In some aspects, at least one of the first plurality of contacts is electrically connected to the embedded component. In some aspects, a third laminate layer structure is disposed below and mounted to a bottom surface of the core, a fourth laminate layer structure is disposed below and mounted to the bottom surface of the third laminate layer, and a second plurality of contacts is disposed on the bottom surface of the fourth laminate layer. In some aspects, vias through the core provide electrical connections from laminate layer(s) above the core to laminate layer(s) below the core.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 2:
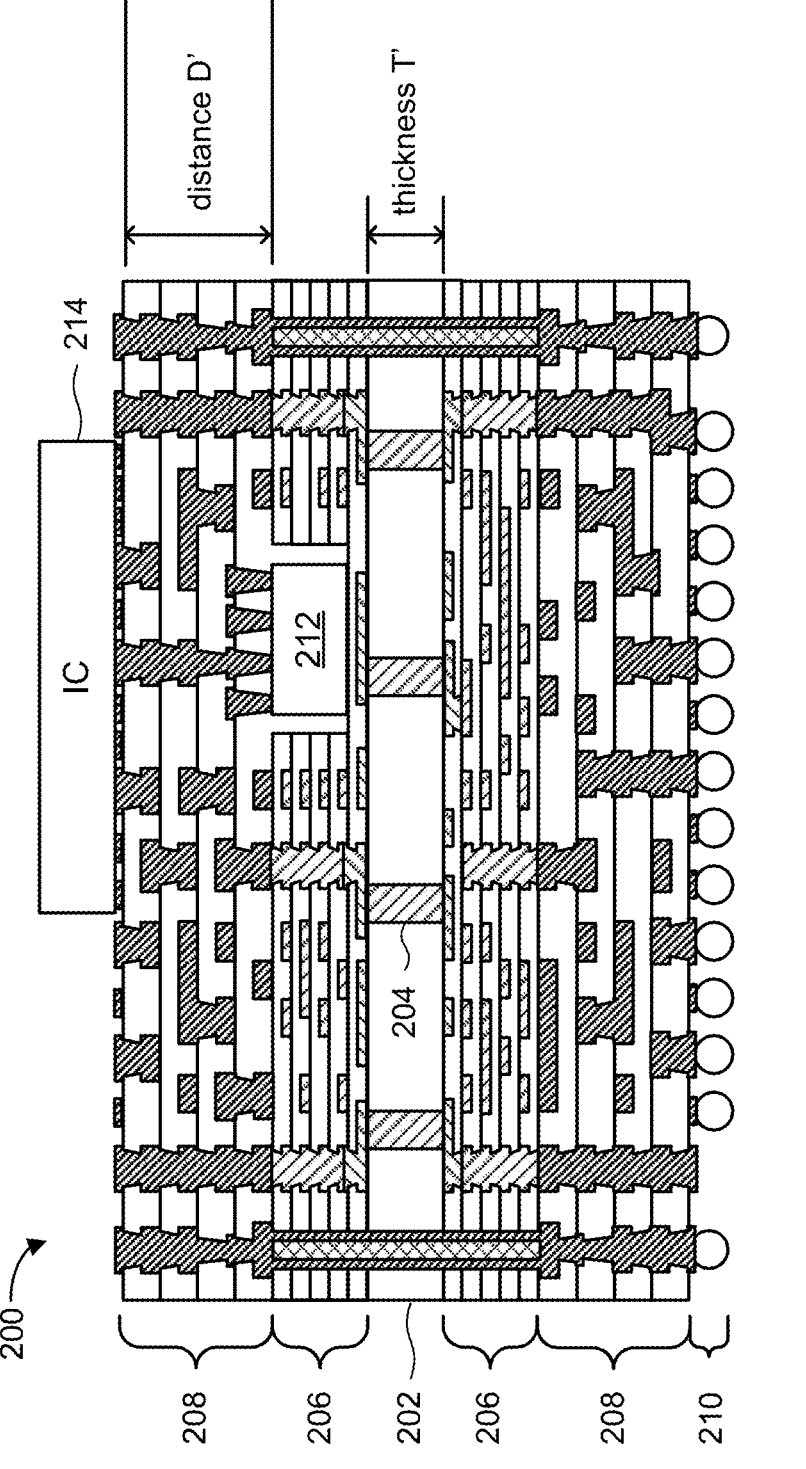
FIG. 2 is a side cross-sectional view of a hybrid core substrate with embedded components, according to aspects of the disclosure.

FIG. 2 is a side cross-sectional view of an apparatus 200 comprising a hybrid core substrate with embedded components, according to aspects of the disclosure. In the example shown in FIG. 2, the apparatus 200 includes a rigid core 202 having one or more through-core vias 204. On either side of the rigid core 202 are multilayer laminate structures 206 (which may be constructed using a "multi-layer core-less" process). Each multilayer laminate structure 206 is connected to its own additional multilayer structure 208. In the example shown in FIG. 2, BGA contacts 210 are attached to the bottom of multilayer structure 208. One or both multilayer laminate structures 206 may include cavities in which one or more components 212 may be embedded. Each component 212 may be electrically connected to one or both multilayer laminate structures 206 (which may be through one of the vias 204) and/or one or both multilayer structures 208 (e.g., via the multilayer laminate structures 206. In the example shown in FIG. 2, an IC 214 is mounted to contacts on the top surface of the top multilayer structure 208.

As can be seen in the example shown in FIG. 2, the thickness T' of the rigid core 202 may be significantly less than the thickness T of the standard core 102, and the distance D' from the IC 214 to the component 212 may be much smaller than the distance D from the IC 108 to the capacitor 110 in FIG. 1.

FIG. 3A through FIG. 3M illustrate portions of a process for fabricating a hybrid core substrate with embedded components, according to aspects of the disclosure.

Figure 3A:
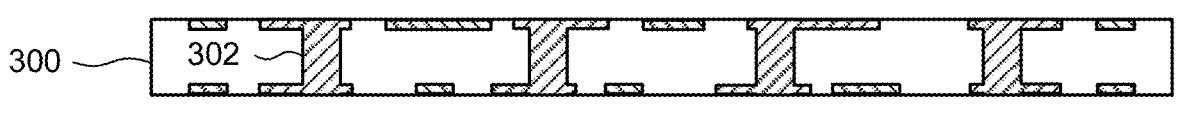
FIG. 3A through FIG. 3M illustrate portions of a process for fabricating a hybrid core substrate with embedded components, according to aspects of the disclosure.

FIG. 3A illustrates a core 300 having one or more through-core vias 302. In some aspects, the core 300 may be a copper clad laminate (CCL) core. In some aspects, the vias 302 are created by drilling and Cu plating. In the example shown in FIG. 3A, the core 300 has undergone a lithography process to create electrical traces on the top and bottom surfaces.

Figure 3B:
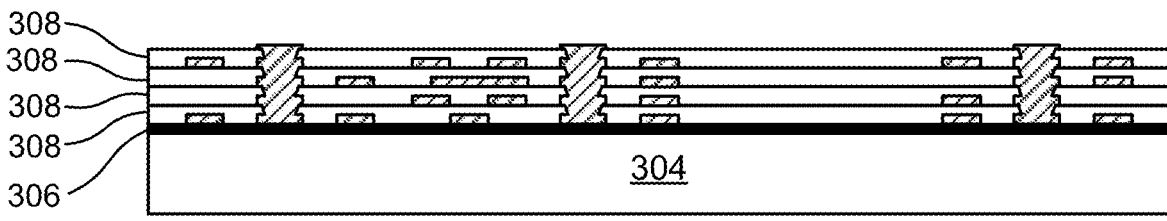

FIG. 3B shows a core 304 having a surface material 306 upon which a first set of laminate layers 308 have been built. The core 304 upon which the laminate layers 308 are built may be the same core 300 or a different core from core 300. The first set of laminate layers 308 may be collectively referred to herein as a first laminate layer structure 308. In some aspects, the first set of laminate layers 308 may comprise Ajinomoto build-up film (ABF) and/or prepreg (PPG), and may be fabricated by a printed circuit board (PCB) or substrate process. While FIG. 3B shows laminate layers 308 only on the top of the core 304, in some aspects, additional laminate layers 308 may also be built on the bottom of the core. The surface material 306 allows the first laminate layer structure 308 to be separated mechanically from the core 304. The surface material 306 may be a sacrificial layer or layers. For example, in some aspects, the surface material 306 comprises two thin copper foil layers that are attached to each other with a weak adhesive.

Figure 3C:

FIG. 3C shows the result of detaching the first laminate layer structure 308 from the core 304, in preparation to make one or more cavities in which a deep trench capacitor (DTC) or other component may be embedded.

Figure 3D:
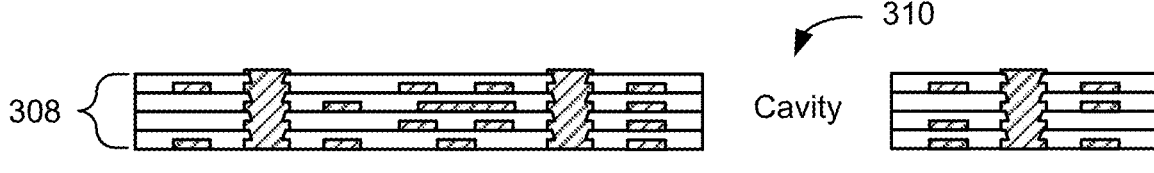

FIG. 3D shows the result after a cavity 310 has been created within the laminate layers 308. In some aspects, the cavity 310 may be created using a mechanical process, e.g., using a drill, laser, high-pressure water, or other cutting tool. Although not visible in the cross section shown in FIG. 3D, the laminate layers 308 on the left side of FIG. 3D are not completely severed from the laminate layers 308 on the right side of FIG. 3D; instead, the cavity 310 is typically a hole or inset when viewed from a top view rather than the cross-sectional view in FIG. 3D. In some aspects, the depth of the cavity 310 may be controlled by adjusting the number of laminate layers 308.

Figure 3E:
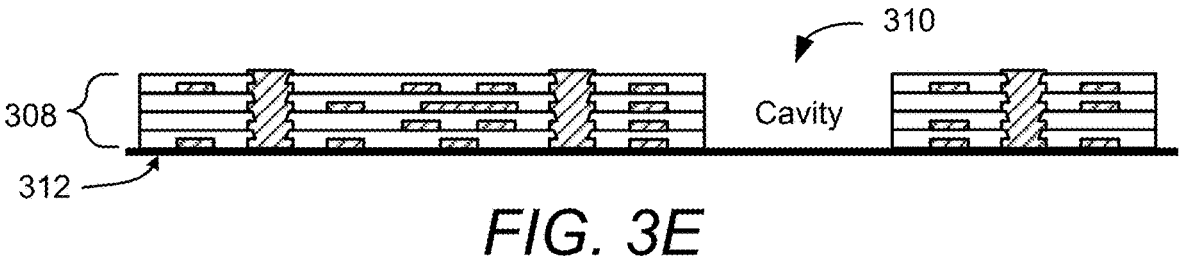

FIG. 3E shows the result after the laminate layers 308 are mounted to adhesive tape 312 or another temporary substrate, in preparation of insertion of one or more components into the cavity 310.

Figure 3F:

FIG. 3F shows the result after a first component 314 is mounted to the adhesive tape 312 within the cavity 310. Examples of components 314 include, but are not limited to, multilayer ceramic capacitors (MLCCs), inductors, chips, chiplets, dies, routing bridges, power management integrated circuits (PMICs), and other bare, packaged, or encapsulated devices. As used herein, the term "chiplet" refers to an integrated circuit block that has been specifically designed to work with other integrated circuit blocks to form larger, more complex chips. A chiplet is a die that is configured to be physically interconnected with at least one other die to operate as a single device. Chiplets may perform specific functions and may be combined with other chiplets performing other specific functions to make up a larger integrated circuit. In some aspects, the first component 314 is placed by a component placement machine (e.g., for packaged devices, etc.) or a die bonding machine (e.g., for bare dies, chiplets, etc.).

Figure 3G:
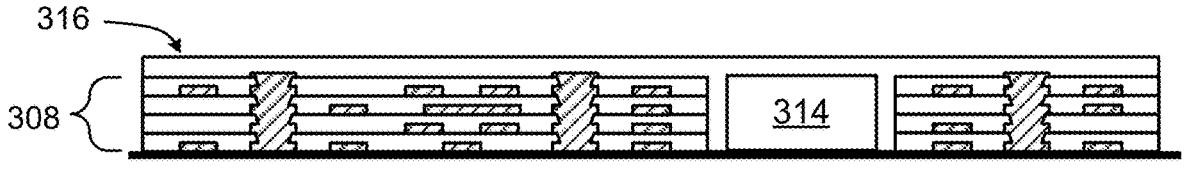

FIG. 3G shows the result after the placement of a first filler layer 316, such as ABF, PPG, or other suitable material.

Figure 3H:
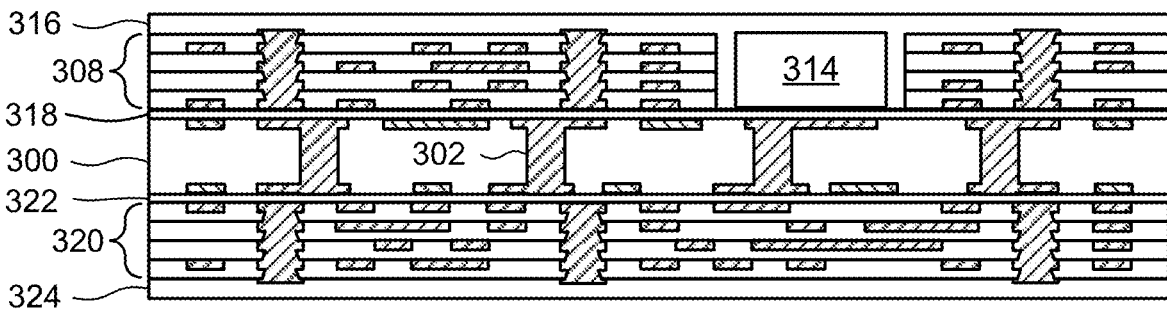

FIG. 3H shows the result after the structure shown in FIG. 3G is removed from the tape 312 and mounted to the top side of the core 300 using a bonding layer 318 and a second set of laminate layers 320 is mounted to the bottom side of the core 300 using a bonding layer 322 and covered by a second filler layer 324. In some aspects, the bonding layers 318 and 322 comprise prepreg. The second set of laminate layers 320 may be collectively referred to herein as a second laminate layer structure 320. In some aspects, the second set of laminate layers 320 may comprise ABF and/or PPG, and may be fabricated by a PCB or substrate process.

Figure 3I:
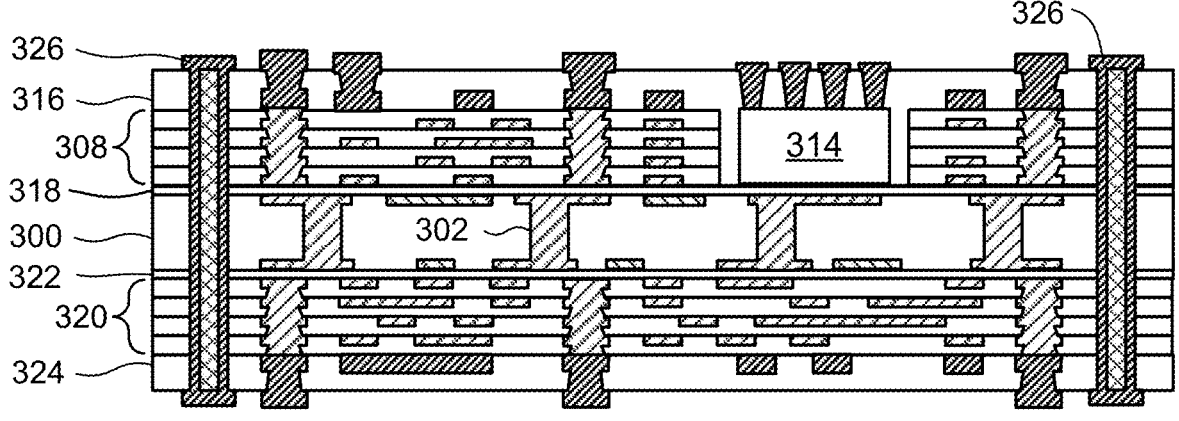

FIG. 3I shows the result after drilling vias 326 to connect the top and bottom surfaces of the structure shown in FIG. 3I and a lithography process to create vias through the first filler layer 316 and to create vias through the second filler layer 324. In the example shown in FIG. 3I, the vias though the first filler layer 316 make electrical contact with the first component 314.

Figure 3J:
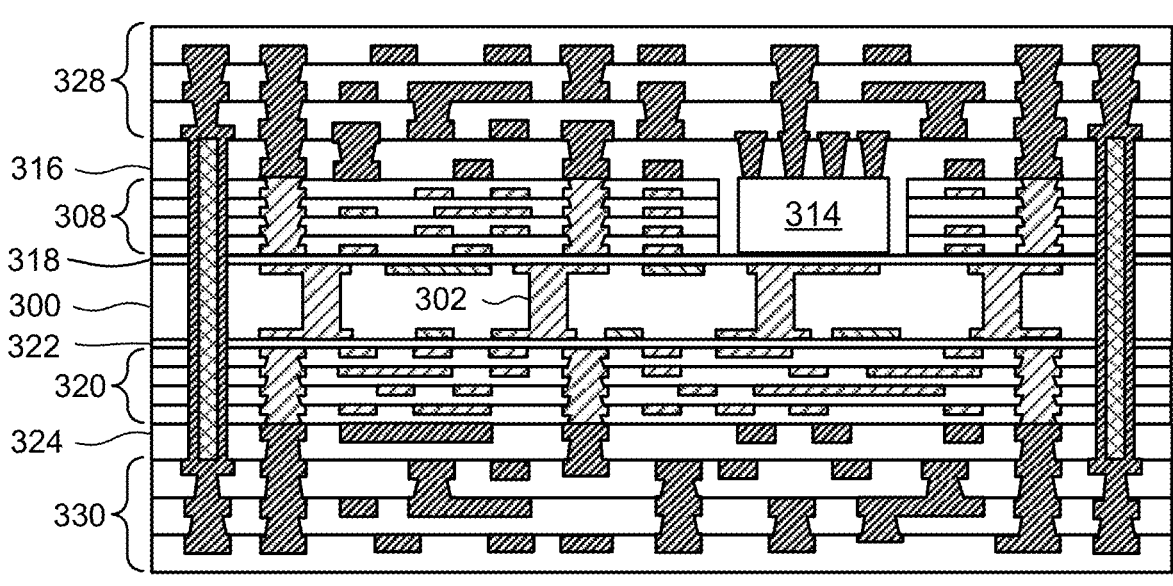

FIG. 3J shows the result after the creation of a third lamination layer structure 328 above the first filler layer 318 and the creation of a fourth lamination layer structure 330 below the second filler layer 324. In some aspects, the layers in the third lamination layer structure 328 and/or the fourth lamination layer structure 330 may comprise ABF and/or PPG, and may be fabricated by a PCB or substrate process. In some aspects, the layers may be created using lamination, drilling, plating, a lithographic process, any front-end process, or a combination thereof.

Figure 3K:
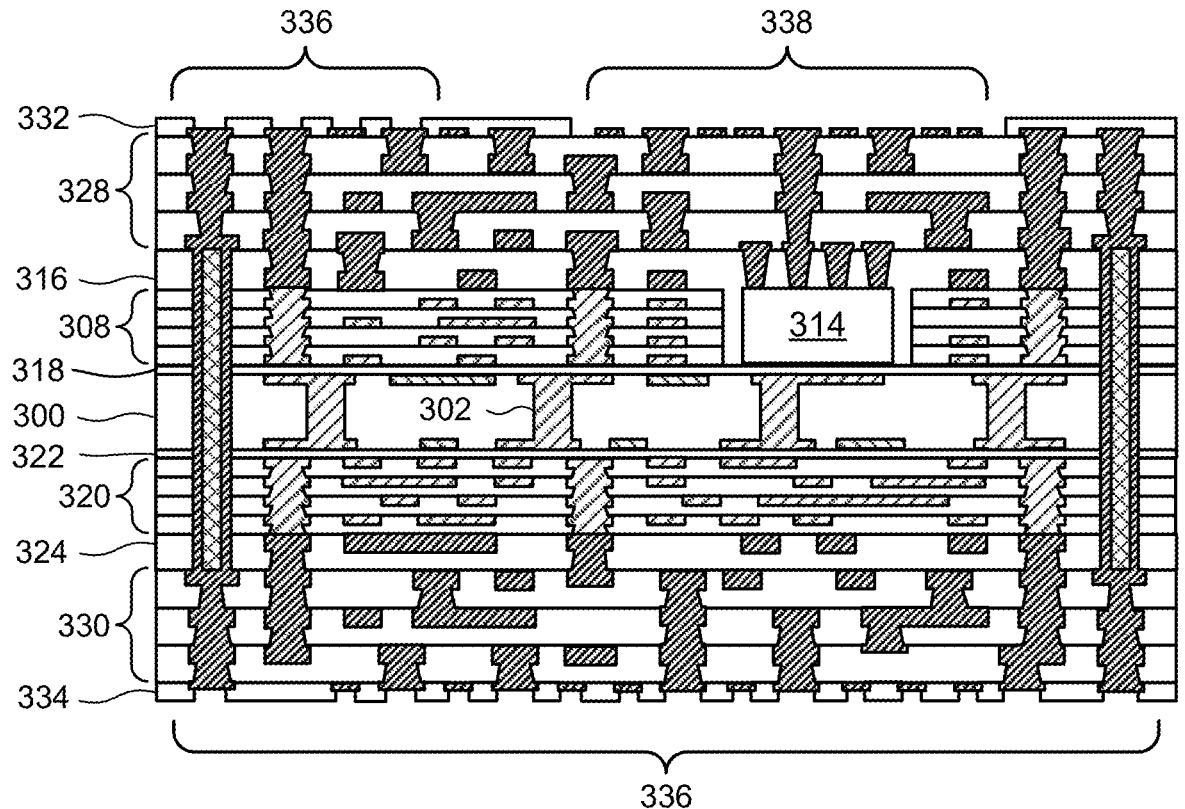

FIG. 3K shows the result after application of a first solder resist (SR) layer 332 on the top surface of the third lamination layer structure 328 and a second SR layer 334 on the bottom surface of the fourth lamination layer structure 330, and surface treatment to create pads. In the example shown in FIG. 3K, both solder mask defined (SMD) pads 336 and non-SMD (NSMD) pads 338 are created, but alternative embodiments may use only SMD pads or only NSMD pads. The resulting structure is a finished hybrid core substrate with embedded component(s).

Figures 3L, 3M:
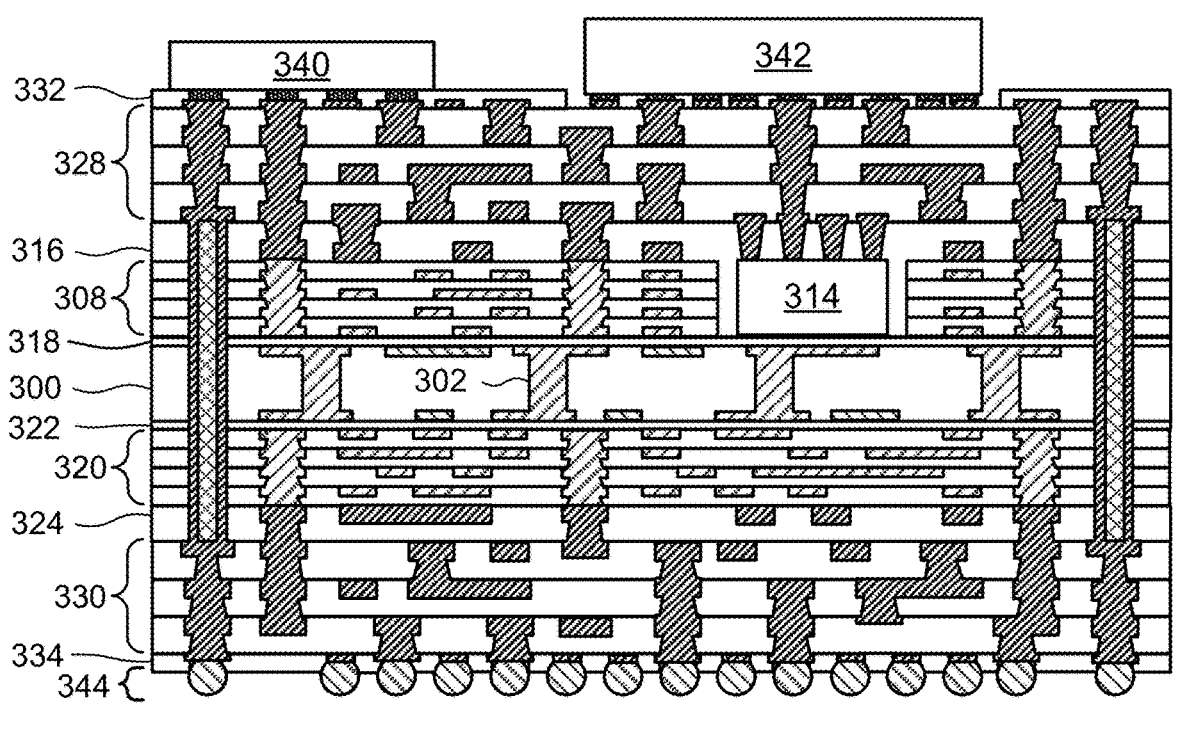

FIG. 3L shows one use of the hybrid core substrate with embedded component(s), which includes multiple surface-mounted components (e.g., a second component 340 and a third component 342) mounted to pads on the top surface and contacts 344 (e.g., ball grid array (BGA), etc.) mounted to pads on the bottom surface. Examples of a surface mounted component may include, but are not limited to, a chip, a chiplet, a package, a packaged device, or other component. It can be seen that the distance from the third component 342 to the first component 314 is smaller than the distance would be from the third component 342 to a component that was mounted to bottom contacts 344.

For example, a conventional thick core thickness may range from 0.15 mm to 2.0 mm, not including the laminate layers, with a thicker core required when supporting multiple laminate layers on top and bottom. As a result, the distance from a top-mounted component to a bottom-mounted component on either side of a conventional thick core can be more than 3.0 mm.

In contrast, embedded components typically have a thickness that ranges from 0.05 mm to 0.8 mm. For a hybrid core substrate such as the one shown in FIG. 3M, in some aspects the core 300 is 0.1 mm to 0.8 mm, and the thickness of each of the first, second, third, and fourth laminate layer structures is 0.1 mm to 0.8 mm. Thus, the total thickness of the hybrid core substrate may be 0.6 mm to 2.0 mm, including the laminate layers. As a result the distance from a top-mounted component to a bottom mounted component is no more than 2.0 mm, and the distance from a top-mounted component to an embedded component may be as small as 0.1 mm to 0.6 mm.

FIG. 3M shows an example hybrid core substrate with components embedded in both the laminate layers 308 above the core 300 and the laminate layers 320 below the core 300. In the example shown in FIG. 3M, first component 314 is embedded within laminate layers 308 and fourth component 346 is embedded within laminate layers 320. It will be understood that there may be multiple components embedded within the laminate layers above or below the core 300.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

The hybrid core substrate with embedded components has several advantages over conventional thick core substrates, including, but not limited to, the following. The hybrid core substrate enables embedding of large components into the substrate without sacrificing stiffness. Embedding components on either or both sides of the rigid core increases embedded passive substrate (EPS) versatility. The "multi-layer coreless with open cavity" construction (e.g., the first laminate layer structure 308 and the second laminate layer structure 320) provides routing flexibility within the hybrid core, which helps reduce the number of additional layers that need to be built up (e.g., the third laminate layer structure 328 and the fourth laminate layer structure 330) above the cavities 310 and the embedded components 314. The distance between an embedded component 314 and a surface mounted component such as third component 342 may be significantly reduced, leading to better performance. For example, an embedded capacitor may be closer to the IC that needs it. Another advantage is that, because the component 314 is embedded into the first laminate layer structure 328 rather than in the core 300, the core 300 does not have a cavity and thus has better structural integrity. Moreover, more of the internal volume of the core 300 may be used for top-to-bottom routing. All of these improvements can result in reduced package size and cost, and the reduced top-surface to bottom-surface distance improves power and signal integrity, which can improve performance and power consumption.

FIG. 4 is a flowchart of an example process 400 for fabricating a hybrid core substrate with components, according to aspects of the disclosure. As shown in FIG. 4, process 400 may include, at block 410, providing a rigid core having a top surface and a bottom surface. In some aspects, providing the rigid core comprises providing a copper-clad laminate (CCL). In some aspects, providing the rigid core comprises providing a core with a thickness in a range from 0.1 mm to 0.8 mm.

As further shown in FIG. 4, process 400 may include, at block 420, forming a first laminate layer structure, disposed above and mounted to the top surface of the rigid core, the first laminate layer structure comprising a first plurality of laminate layers stacked vertically, each laminate layer in the first laminate layer structure comprising a metallization structure, the first laminate layer structure comprising a cavity in which a first component is embedded. In some aspects, the first laminate layer structure comprises pre-preg.

As further shown in FIG. 4, process 400 may include, at block 430, forming a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component. In some aspects, the second laminate layer structure comprises pre-preg. In some aspects, the first component comprises a capacitor, an inductor, or an integrated circuit. In some aspects, the first component comprises a chip, a chiplet, or a packaged device.

As further shown in FIG. 4, process 400 may include, at block 440, forming a first plurality of contacts disposed on the top surface of the second laminate layer structure and electrically connected to the second laminate layer structure. In some aspects, forming the first plurality of contacts comprises forming at least one contact of the first plurality of contacts as electrically connected to the first component through the second laminate layer structure.

In some aspects, process 400 also includes forming a third laminate layer structure, disposed below and mounted to the bottom surface of the rigid core, the third laminate layer structure comprising a third plurality of laminate layers stacked vertically, each laminate layer in the third laminate layer structure comprising a metallization structure. In some aspects, the third laminate layer structure comprises pre-preg.

In some aspects, process 400 also includes forming a fourth laminate layer structure, disposed below and mounted to a bottom surface of the third laminate layer structure, the fourth laminate layer structure comprising a fourth plurality of laminate layers stacked vertically, each laminate layer in the fourth laminate layer structure comprising a metallization structure, the fourth laminate layer structure having at least one electrical connection to the third laminate layer structure, and forming a second plurality of contacts disposed on the bottom surface of the fourth laminate layer structure and electrically connected to the fourth laminate layer structure. In some aspects, the fourth laminate layer structure comprises pre-preg.

In some aspects, forming the third laminate layer structure comprises forming a second cavity in which a second component is embedded and wherein forming the fourth laminate layer structure comprises forming at least one electrical connection to the second component.

In some aspects, providing the rigid core comprises providing at least one through-core via providing an electrical path from the first laminate layer structure to the third laminate layer structure. In some aspects, the process includes forming at least one electrical connection between the first laminate layer structure and the third laminate layer structure. In some aspects, the process includes forming at least one electrical connection between the second laminate layer structure and the fourth laminate layer structure. In some aspects, the process includes forming at least one electrical connection between at least one of the first plurality of contacts and at least one of the second plurality of contacts.

In some aspects, a thickness of the completed hybrid core substrate is in a range from 0.6 mm to 2.0 mm.

Process 400 may include additional implementations, such as any single implementation or any combination of implementations described below and/or in connection with one or more other processes described elsewhere herein. Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
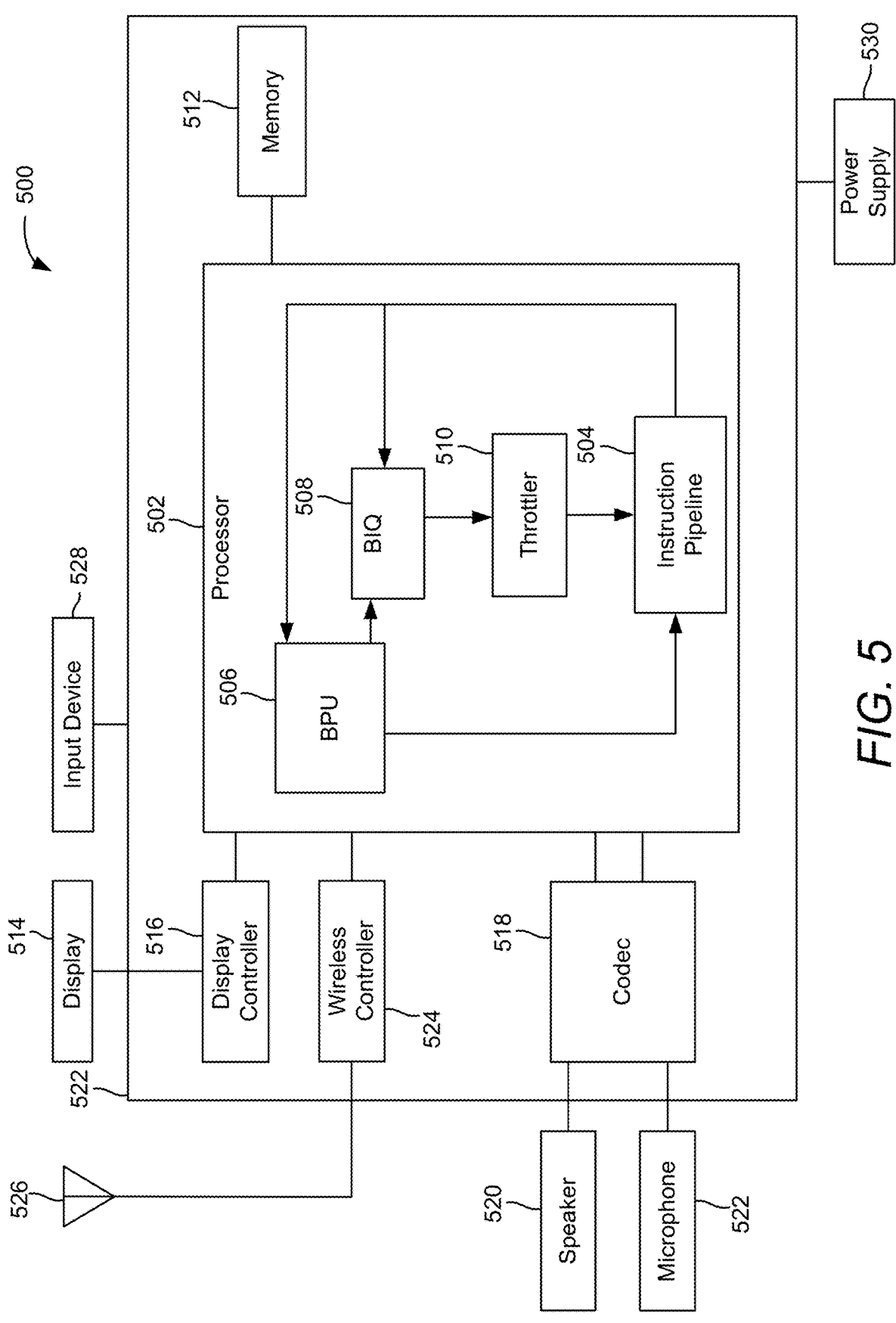
FIG. 5 illustrates an exemplary mobile device in accordance with one or more aspects of the disclosure.

FIG. 5 illustrates an exemplary mobile device in accordance with some examples of the disclosure. Referring now to FIG. 5, a block diagram of a mobile device that is configured according to exemplary aspects is depicted and generally designated mobile device 500. In some aspects, mobile device 500 may be configured as a wireless communication device. As shown, mobile device 500 includes processor 502. Processor 502 is shown to comprise instruction pipeline 504, buffer processing unit (BPU) 506, branch instruction queue (BIQ) 508, and throttler 510 as is well known in the art. Other well-known details (e.g., counters, entries, confidence fields, weighted sum, comparator, etc.) of these blocks have been omitted from this view of processor 502 for the sake of clarity. Processor 502 may be communicatively coupled to memory 512 over a link, which may be a die-to-die or chip-to-chip link. Mobile device 500 also includes display 514 and display controller 516, with display controller 516 coupled to processor 502 and to display 514.

In some aspects, FIG. 5 may include coder/decoder (CODEC) 518 (e.g., an audio and/or voice CODEC) coupled to processor 502; speaker 520 and microphone 522 coupled to CODEC 518; and wireless controller circuits 524 (which may include a modem, radio frequency (RF) circuitry, filters, etc., which may be implemented using one or more flip-chip devices, as disclosed herein) coupled to wireless antenna 526 and to processor 502.

In a particular aspect, where one or more of the above-mentioned blocks are present, processor 502, display controller 516, memory 512, CODEC 518, and wireless controller circuits 524 can be included in a system-in-package or system-on-chip device, which may be implemented in whole or part using the techniques disclosed herein. Input device 528 (e.g., physical or virtual keyboard), power supply 530 (e.g., battery), display 514, input device 528, speaker

520, microphone 522, wireless antenna 526, and power supply 530 may be external to the system-on-chip device and may be coupled to a component of the system-on-chip device, such as an interface or a controller.

It should be noted that although FIG. 5 depicts a mobile device, the processor 502 and memory 512 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
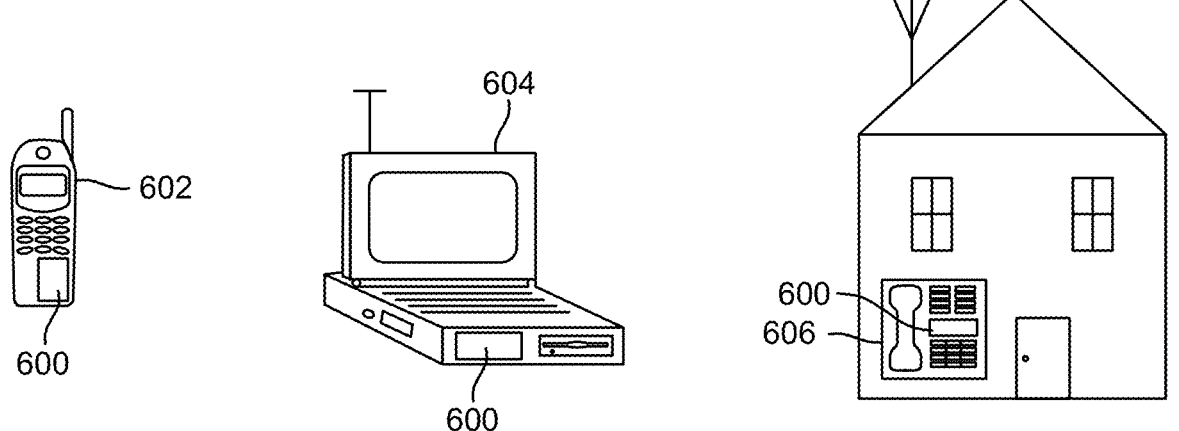
FIG. 6 illustrates various electronic devices that may be integrated with any of the aforementioned integrated device or semiconductor device in accordance with one or more aspects of the disclosure.

FIG. 6 illustrates various electronic devices that may be integrated with any of the aforementioned integrated device or semiconductor device accordance with various examples of the disclosure. For example, a mobile phone device 602, a laptop computer device 604, and a fixed location terminal device 606 may each be considered generally user equipment (UE) and may include a device 600 as described herein, for example. The device may be, for example, any of the integrated circuits, dies, integrated devices, integrated device packages, integrated circuit devices, device packages, integrated circuit (IC) packages, package-on-package devices described herein. The mobile phone device 602, laptop computer device 604, and fixed location terminal device 606 illustrated in FIG. 6 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A hybrid core substrate, comprising: a rigid core having a top surface and a bottom surface; a first laminate layer structure having a top surface and a bottom surface, the first laminate layer structure disposed above and mounted to the top surface of the rigid core, the first laminate layer structure comprising a first plurality of laminate layers stacked vertically, each laminate layer in the first laminate layer structure comprising a metallization structure, and the first laminate layer structure comprising a cavity in which a first component is embedded; a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component; and a first plurality of contacts disposed on the top surface of the second laminate layer structure and electrically connected to the second laminate layer structure.

Clause 2. The hybrid core substrate of clause 1, wherein the rigid core comprises a copper-clad laminate (CCL).

Clause 3. The hybrid core substrate of any of clauses 1 to 2, wherein at least one of the first laminate layer structure or the second laminate layer structure comprises pre-preg.

Clause 4. The hybrid core substrate of any of clauses 1 to 3, wherein the first component comprises a capacitor, an inductor, or an integrated circuit.

Clause 5. The hybrid core substrate of any of clauses 1 to 4, wherein the first component comprises a chip, a chiplet, or a packaged device.

Clause 6. The hybrid core substrate of any of clauses 1 to 5, wherein at least one contact of the first plurality of contacts is electrically connected to the first component through the second laminate layer structure.

Clause 7. The hybrid core substrate of any of clauses 1 to 6, further comprising: a third laminate layer structure, disposed below and mounted to the bottom surface of the rigid core, the third laminate layer structure comprising a third plurality of laminate layers stacked vertically, each laminate layer in the third laminate layer structure comprising a metallization structure; a fourth laminate layer structure, disposed below and mounted to a bottom surface of the third laminate layer structure, the fourth laminate layer structure comprising a fourth plurality of laminate layers stacked vertically, each laminate layer in the fourth laminate layer structure comprising a metallization structure, the fourth laminate layer structure having at least one electrical connection to the third laminate layer structure; and a second plurality of contacts disposed on the bottom surface of the fourth laminate layer structure and electrically connected to the fourth laminate layer structure.

Clause 8. The hybrid core substrate of clause 7, wherein at least one of the third laminate layer structure or the fourth laminate layer structure comprises pre-preg.

Clause 9. The hybrid core substrate of any of clauses 7 to 8, wherein the third laminate layer structure comprises a second cavity in which a second component is embedded and wherein the fourth laminate layer structure comprises at least one electrical connection to the second component.

Clause 10. The hybrid core substrate of any of clauses 7 to 9, wherein the rigid core comprises at least one through-core via providing an electrical path from the first laminate layer structure to the third laminate layer structure.

Clause 11. The hybrid core substrate of clause 10, comprising at least one electrical connection between the first laminate layer structure and the third laminate layer structure.

Clause 12. The hybrid core substrate of any of clauses 10 to 11, comprising at least one electrical connection between the second laminate layer structure and the fourth laminate layer structure.

Clause 13. The hybrid core substrate of any of clauses 10 to 12, comprising at least one electrical connection between at least one of the first plurality of contacts and at least one of the second plurality of contacts.

Clause 14. The hybrid core substrate of any of clauses 1 to 13, wherein a thickness of the core is in a range from 0.1 mm to 0.8 mm.

Clause 15. The hybrid core substrate of any of clauses 1 to 14, wherein a thickness of the hybrid core substrate is in a range from 0.6 mm to 2.0 mm.

Clause 16. A method for fabricating a hybrid core substrate, the method comprising: providing a rigid core having a top surface and a bottom surface; forming a first laminate layer structure, disposed above and mounted to the top surface of the rigid core, the first laminate layer structure comprising a first plurality of laminate layers stacked vertically, each laminate layer in the first laminate layer structure comprising a metallization structure, the first laminate layer structure comprising a cavity in which a first component is embedded; forming a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component; and forming a first plurality of contacts disposed on the top surface of the second laminate layer structure and electrically connected to the second laminate layer structure.

Clause 17. The method of clause 16, wherein providing the rigid core comprises providing a copper-clad laminate (CCL).

Clause 18. The method of any of clauses 16 to 17, wherein at least one of the first laminate layer structure or the second laminate layer structure comprises pre-preg.

Clause 19. The method of any of clauses 16 to 18, wherein the first component comprises a capacitor, an inductor, or an integrated circuit.

Clause 20. The method of any of clauses 16 to 19, wherein the first component comprises a chip, a chiplet, or a packaged device.

Clause 21. The method of any of clauses 16 to 20, wherein forming the first plurality of contacts comprises forming at least one contact of the first plurality of contacts as electrically connected to the first component through the second laminate layer structure.

Clause 22. The method of any of clauses 16 to 21, further comprising: forming a third laminate layer structure, disposed below and mounted to the bottom surface of the rigid core, the third laminate layer structure comprising a third plurality of laminate layers stacked vertically, each laminate layer in the third laminate layer structure comprising a metallization structure; forming a fourth laminate layer structure, disposed below and mounted to a bottom surface of the third laminate layer structure, the fourth laminate layer structure comprising a fourth plurality of laminate layers stacked vertically, each laminate layer in the fourth laminate layer structure comprising a metallization structure, the fourth laminate layer structure having at least one electrical connection to the third laminate layer structure; and forming a second plurality of contacts disposed on the bottom surface of the fourth laminate layer structure and electrically connected to the fourth laminate layer structure.

Clause 23. The method of clause 22, wherein at least one of the third laminate layer structure or the fourth laminate layer structure comprises pre-preg.

Clause 24. The method of any of clauses 22 to 23, wherein forming the third laminate layer structure comprises forming a second cavity in which a second component is embedded and wherein forming the fourth laminate layer structure comprises forming at least one electrical connection to the second component.

Clause 25. The method of any of clauses 22 to 24, wherein providing the rigid core comprises providing at least one through-core via providing an electrical path from the first laminate layer structure to the third laminate layer structure.

Clause 26. The method of clause 25, comprising forming at least one electrical connection between the first laminate layer structure and the third laminate layer structure.

Clause 27. The method of any of clauses 25 to 26, comprising forming at least one electrical connection between the second laminate layer structure and the fourth laminate layer structure.

Clause 28. The method of any of clauses 25 to 27, comprising forming at least one electrical connection between at least one of the first plurality of contacts and at least one of the second plurality of contacts.

Clause 29. The method of any of clauses 16 to 28, wherein providing the rigid core comprises providing a core with a thickness in a range from 0.1 mm to 0.8 mm.

Clause 30. The method of any of clauses 16 to 29, wherein a thickness of the hybrid core substrate is in a range from 0.6 mm to 2.0 mm.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A hybrid core substrate, comprising:
a rigid core having a top surface and a bottom surface, the rigid core remains as a permanent structural element of the hybrid core substrate after fabrication;
a first laminate layer structure having a top surface and a bottom surface, the first laminate layer structure disposed above and mounted to the top surface of the rigid core, the first laminate layer structure comprising a first plurality of laminate layers stacked vertically, each laminate layer of the first plurality of laminate layers comprising a metallization structure, and the first laminate layer structure comprising a cavity in which a first component is embedded;
a second laminate layer structure, disposed above and mounted to a top surface of the first laminate layer structure, the second laminate layer structure comprising a second plurality of laminate layers stacked vertically, each laminate layer of the second plurality of laminate layers comprising a metallization structure, the second laminate layer structure having at least one electrical connection to the first laminate layer structure and at least one electrical connection to the first component;
a first plurality of contacts disposed on the top surface of the second laminate layer structure and electrically connected to the second laminate layer structure; and
a bonding layer comprising pre-preg, the bonding layer disposed between the rigid core and the first laminate layer structure.

2. The hybrid core substrate of claim 1, wherein the rigid core comprises a copper-clad laminate (CCL).

3. The hybrid core substrate of claim 1, wherein at least one of the first laminate layer structure or the second laminate layer structure comprises pre-preg.

4. The hybrid core substrate of claim 1, wherein the first component comprises a capacitor, an inductor, or an integrated circuit.

5. The hybrid core substrate of claim 1, wherein the first component comprises a chip, a chiplet, or a packaged device.

6. The hybrid core substrate of claim 1, wherein at least one contact of the first plurality of contacts is electrically connected to the first component through the second laminate layer structure.

7. The hybrid core substrate of claim 1, further comprising:
a third laminate layer structure, disposed below and mounted to the bottom surface of the rigid core, the third laminate layer structure comprising a third plurality of laminate layers stacked vertically, each laminate layer of the third plurality of laminate layers comprising a metallization structure;
a fourth laminate layer structure, disposed below and mounted to a bottom surface of the third laminate layer structure, the fourth laminate layer structure comprising a fourth plurality of laminate layers stacked vertically, each laminate layer of the fourth plurality of laminate layers comprising a metallization structure, the fourth laminate layer structure having at least one electrical connection to the third laminate layer structure; and
a second plurality of contacts disposed on the bottom surface of the fourth laminate layer structure and electrically connected to the fourth laminate layer structure.

8. The hybrid core substrate of claim 7, wherein at least one of the third laminate layer structure or the fourth laminate layer structure comprises pre-preg.

9. The hybrid core substrate of claim 7, wherein the third laminate layer structure comprises a second cavity in which a second component is embedded and wherein the fourth laminate layer structure comprises at least one electrical connection to the second component.

10. The hybrid core substrate of claim 7, wherein the rigid core comprises at least one through-core via providing an electrical path from the first laminate layer structure to the third laminate layer structure.

11. The hybrid core substrate of claim 10, comprising at least one electrical connection between the first laminate layer structure and the third laminate layer structure.

12. The hybrid core substrate of claim 10, comprising at least one electrical connection between the second laminate layer structure and the fourth laminate layer structure.

13. The hybrid core substrate of claim 10, comprising at least one electrical connection between at least one of the first plurality of contacts and at least one of the second plurality of contacts.

14. The hybrid core substrate of claim 1, wherein a thickness of the rigid core is in a range from 0.1 mm to 0.8 mm.

15. The hybrid core substrate of claim 1, wherein a thickness of the hybrid core substrate is in a range from 0.6 mm to 2.0 mm.

16. A method for fabricating a hybrid core substrate, the method comprising:

providing a rigid core having a top surface and a bottom surface, the rigid core remains as a permanent structural element of the hybrid core substrate after fabrication;

forming a first laminate layer structure, disposed above and mounted to the top surface of the rigid core, the first laminate layer structure comprising a first plurality of laminate layers stacked vertically, each laminate layer in the first laminate layer structure comprising a metallization structure, the first laminate layer structure comprising a cavity in which a first component is embedded;

forming a second laminate layer structure, disposed above and mounted to a top surface of the first laminate layer structure, the second laminate layer structure comprising a second plurality of laminate layers stacked vertically, each laminate layer in the second laminate layer structure comprising a metallization structure, the second laminate layer structure having at least one electrical connection to the first laminate layer structure and at least one electrical connection to the first component;

forming a first plurality of contacts disposed on the top surface of the second laminate layer structure and electrically connected to the second laminate layer structure; and disposing a bonding layer comprising pre-preg between the rigid core and the first laminate layer structure.

17. The method of claim 16, wherein providing the rigid core comprises providing a copper-clad laminate (CCL).

18. The method of claim 16, wherein at least one of the first laminate layer structure or the second laminate layer structure comprises pre-preg.

19. The method of claim 16, wherein the first component comprises a capacitor, an inductor, or an integrated circuit.

20. The method of claim 16, wherein the first component comprises a chip, a chiplet, or a packaged device.

21. The method of claim 16, wherein forming the first plurality of contacts comprises forming at least one contact of the first plurality of contacts as electrically connected to the first component through the second laminate layer structure.

22. The method of claim 16, further comprising:

forming a third laminate layer structure, disposed below and mounted to the bottom surface of the rigid core, the third laminate layer structure comprising a third plurality of laminate layers stacked vertically, each laminate layer in the third laminate layer structure comprising a metallization structure;

forming a fourth laminate layer structure, disposed below and mounted to a bottom surface of the third laminate layer structure, the fourth laminate layer structure comprising a fourth plurality of laminate layers stacked vertically, each laminate layer in the fourth laminate layer structure comprising a metallization structure, the fourth laminate layer structure having at least one electrical connection to the third laminate layer structure; and forming a second plurality of contacts disposed on the bottom surface of the fourth laminate layer structure and electrically connected to the fourth laminate layer structure.

23. The method of claim 22, wherein at least one of the third laminate layer structure or the fourth laminate layer structure comprises pre-preg.

24. The method of claim 22, wherein forming the third laminate layer structure comprises forming a second cavity in which a second component is embedded and wherein forming the fourth laminate layer structure comprises forming at least one electrical connection to the second component.

25. The method of claim 22, wherein providing the rigid core comprises providing at least one through-core via providing an electrical path from the first laminate layer structure to the third laminate layer structure.

26. The method of claim 25, comprising forming at least one electrical connection between the first laminate layer structure and the third laminate layer structure.

27. The method of claim 25, comprising forming at least one electrical connection between the second laminate layer structure and the fourth laminate layer structure.

28. The method of claim 25, comprising forming at least one electrical connection between at least one of the first plurality of contacts and at least one of the second plurality of contacts.

29. The method of claim 16, wherein providing the rigid core comprises providing a core with a thickness in a range from 0.1 mm to 0.8 mm.

30. The method of claim 16, wherein a thickness of the hybrid core substrate is in a range from 0.6 mm to 2.0 mm.

* * * * *